United States Patent [19]

Mihara et al.

[11] Patent Number: 4,777,518

[45] Date of Patent: Oct. 11, 1988

[54] SEMICONDUCTOR DEVICE INCLUDING GATE PROTECTION CIRCUIT WITH CAPACITOR UNDER INPUT PAD

[75] Inventors: Teruyoshi Mihara, Yokosuka; Hideo Muro, Yokohama, both of Japan

[73] Assignee: Nissan Motor Company, Limited, Yokohama, Japan

[21] Appl. No.: 40,722

[22] Filed: Apr. 20, 1987

Related U.S. Application Data

[63] Continuation of Ser. No. 769,792, Aug. 26, 1985, abandoned, which is a continuation of Ser. No. 445,085, Nov. 29, 1982, abandoned.

[30] Foreign Application Priority Data

Jan. 11, 1982 [JP] Japan .................................. 57-1717

[51] Int. Cl.$^4$ ............................................ H01L 29/78
[52] U.S. Cl. .................... 357/23.13; 357/13; 357/41; 357/51; 357/59; 361/56; 361/91
[58] Field of Search ............. 357/23, 13, 59 F, 51, 357/41; 361/56, 91

[56] References Cited

U.S. PATENT DOCUMENTS

| | | | |
|---|---|---|---|
| 3,649,885 | 3/1972 | Nienhuis | 357/23 GP |
| 3,673,427 | 6/1972 | Mc Coy et al. | 357/23 GP |
| 4,131,908 | 12/1978 | Daub et al. | 357/23 GP |
| 4,246,502 | 1/1981 | Kubinec | 357/23 |
| 4,423,431 | 12/1983 | Sasaki | 357/23 GP |
| 4,438,449 | 3/1984 | Usuda | 357/23 GP |
| 4,509,067 | 2/1985 | Minami et al. | 357/23 |

FOREIGN PATENT DOCUMENTS

| | | | |
|---|---|---|---|
| 52-14384 | 2/1977 | Japan . | |
| 52-43382 | 4/1977 | Japan | 357/23 GP |
| 54-101283 | 8/1979 | Japan . | |
| 55-143061 | 11/1980 | Japan | 357/23.13 |
| 1357558 | 6/1974 | United Kingdom . | |

OTHER PUBLICATIONS

P. Richman, "Char. and Oper. of Mos Fets," ©1967, McGraw-Hill, Inc., TK7871.95R5, pp. 101–103.
Society of Automotive Engineering, "Recommended Environmental Practices for Electronic Equipment Design—SAE J1211", SAE Recommended Practice pp. 22.80–22.96, 1978.
Society of Automotive Engineering, "Electromagnetic Susceptibility Procedures for Vehicle Components (Except Aircraft)—SAE J1113a, SAE Recommended Practice, pp. 22.62–22.73, 1975, revised 1978.

*Primary Examiner*—Joseph E. Clawson, Jr.
*Attorney, Agent, or Firm*—Foley & Lardner, Schwartz, Jeffery, Schwaab, Mack, Blumenthal & Evans

[57] ABSTRACT

A semiconductor device including a gate protection circuit in which a N-type or P-type high-concentration impurity semiconductor region is formed under the input terminal such as a bonding pad and is connected to the power supply line or the ground line. Since a distributed capacitance is formed between the bonding pad and the impurity semiconductor region with the silicon oxide film sandwiched therebetween as a dielectric, high-frequency high surge voltage applied to the input bonding pad is readily by-passed from the bonding pad, through the insulating oxide film and the impurity semiconductor region, to the power or ground line, without flowing to other circuits formed on the same substrate, thereby it being possible to securely prevent the circuits on the substrate from being activated erroneously.

6 Claims, 2 Drawing Sheets

SEMICONDUCTOR DEVICE INCLUDING GATE PROTECTION CIRCUIT WITH CAPACITOR UNDER INPUT PAD

This application is continuation of application Ser. No. 769,792, filed Aug. 26, 1985 abandoned; which is a continuation of application Ser. No. 445,085 filed Nov. 29, 1982, now abandoned.

BACKGROUND OF THE INVENTION

1. Field of the Invention

The present invention relates generally to a semiconductor device including a gate protection circuit, and more specifically to a surge voltage protection circuit provided for a semiconductor device. This protection circuit is necessary for protecting the gate from high-frequency high surge voltage inputted through an input terminal such as a bonding pad and for preventing the semiconductor circuits from being activated erroneously by the surge voltage.

2. Description of the Prior Art

The background of the present invention will be explained with its application to the semiconductor integrated circuit, in particular, to an insulated gate field effect transistor used for an automotive vehicle.

An insulated gate field effect transistor is termed MOS FET since the gate is formed in combination with metal (gate electrode), oxide (gate insulator) and semiconductor, being widely used in various fields. However, since the gate oxide film in this insulated gate field effect transistor is relatively thin and the gate impedance thereof is fairly high, if high-frequency high surge voltage is inputted through the bonding pad from an external device, there are some problems in that the gate is broken down or the circuit formed on a semiconductor silicon substrate is erroneously activated due to the high surge voltage. In applying MOS FETs to an automotive vehicle, in particular, the above-mentioned problems are serious because an automotive vehicle is usually provided with various elements or apparatus which will readily generate high-frequency high surge voltage, for instance, such as an alternator, a starter motor, an ignition system, switches, etc. In more detail, when such an inductive element as described above is turned on or off at a high speed, a kind of electromagnetic wave is generated as electric noise from the inductive element. Therefore, when this electromagnetic noise wave is received by a semiconductor device having a high input impedance such as a field effect transistor, a surge voltage as high as 400 to 500 volts sometimes develops across the input terminals of a semiconductor device.

In order to protect the semiconductor device from the surge voltage, there is well known a method of providing a gate protection circuit, e.g., a surge voltage protection resistor connected between the input terminal and the gate of the field effect transistor. When such a gate protection resistor is additionally provided, since the surge voltage inputted through the bonding pad can be attenuated ohmically, it is possible to prevent the transistor gate from being broken down or the transistor from being activated erroneously.

By the way, in an automotive vehicle, there often exists a case where the surge voltage develops at the input terminal of a field effect transistor, the voltage of which is as high as several hundred volts and the frequency of which is as high as several magahertz to several tens of megahertz. In the case where such high-frequency high surge voltage is inputted to the device, since the gate protection circuit is formed together with the transistor, it is possible to fairly reduce the surge voltage inputted through the bonding pad 9 before the surge voltage reaches the gate of the transistor, as far as the frequency of surge is relatively low.

However, when the frequency of surge is extraordinary high, the surge current easily leaks from the bonding pad to other circuits formed on the semiconductor substrate, via the substrate, because a distributed capacitance will exist between the bonding pad and the silicon substrate with the insulating silicon oxide film sandwiched therebetween as a dielectric. When surge current leaks from the bonding pad to other circuits formed on the substrate, there exists a danger that the circuits are activated erroneously.

The structure of the prior-art gate protection circuit formed in a semiconductor device will be described in more detail hereinafter with reference to the attached drawings under DETAILED DESCRIPTION OF THE PREFERRED EMBODIMENTS.

SUMMARY OF THE INVENTION

With these problems in mind, therefore, it is the primary object of the present invention to provide a semiconductor device including a gate protection circuit which can effectively by-pass high-frequency surge voltage or current to the power supply line or the ground line of the semiconductor device and thus prevent other circuits formed on the same substrate from the being activated erroneously due to the high-frequency surge voltage.

To achieve the above-mentioned object, the semiconductor device including a gate protection circuit according to the present invention comprises an N-type or a P-type high concentration impurity semiconductor region formed under the input terminal such as the bonding pad and connected to the power supply line or the ground line of the semiconductor device.

When such impurity region as described above is formed under the bonding pad, since a relatively large distributed capacitance is formed between the bonding pad and the impurity semiconductor region with the insulating silicon oxide film sandwiched therebetween as a dielectric, it is possible to effectively by-pass high-frequency high surge voltage applied to the input bonding pad to the power supply line or the ground line via the insulating silicon oxide film and the impurity semiconductor region; that is, it is possible to prevent the circuits on the same substrate from being activated erroneously.

BRIEF DESCRIPTION OF THE DRAWINGS

The features and advantages of the semiconductor device including a gate protection circuit according to the present invention over prior-art semiconductor devices will be more clearly appreciated from the following description of the preferred embodiments of the invention taken in conjunction with the accompanying drawings in which like reference numerals designate the same or similar elements or sections throughout the figures thereof and in which.

DETAILED DESCRIPTION OF THE PREFERRED EMBODIMENTS

To facilitate understanding of the present invention, a brief reference will be made to a prior-art gate protection circuit for a C-MOS semiconductor integrated circuit, with reference to the attached drawings.

Figure 1:
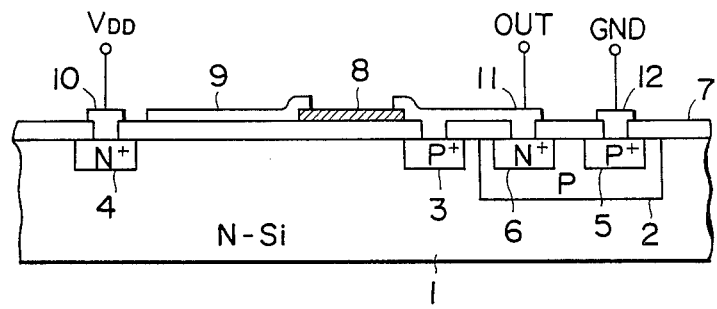
FIG. 1 is a cross-sectional view showing the structure of a typical gate protection circuit provided for a conventional insulation-gate semiconductor integrated circuit.

FIG. 1 shows a typical prior-art gate protection circuit used for a C-MOS semiconductor integrated circuit.

In the figure, the reference numeral 1 denotes an N-type silicon semiconductor substrate chip; the reference numeral 2 denotes a P well formed under a silicon oxide film by diffusing, for instance, boron (B), which becomes a base of, for instance, a N-MOS FET; the reference numerals 3 and 5 denote P-type impurity semiconductor regions; the numerals 4 and 6 denote N-type impurity semiconductor regions; the numeral 7 denotes a insulating silicon oxide film; the numeral 8 denotes a polycrystal silicon gate protection resistor; the numeral 9 denotes a bonding or input terminal pad; the numeral 10 denotes a power supply terminal or line $V_{DD}$; the numeral 11 denotes a gate terminal or line OUT; the numeral 12 denotes a ground terminal or line GND.

The P-type impurity region 5 and N-type impurity region 6 are formed within the P well 2. The insulating silicon oxide film 7 ($SiO_2$) is formed so as to cover throughout the surface of the silicon semiconductor substrate 1. One end of the polycrystal silicon protection resistor 8 is connected to the bonding pad 9 to which an external device is connected, and the other end of the resistor 8 is connected to the gate of an insulated-gate type transistor and to the P-type region 3 and the N-type region 6 in which clamping diodes are formed. The terminal 10 is connected to a power supply $V_{DD}$; the terminal 11 is connected to a gate OUT of circuits on the substrate 1; the terminal 12 is connected to the ground GND.

Figure 2:
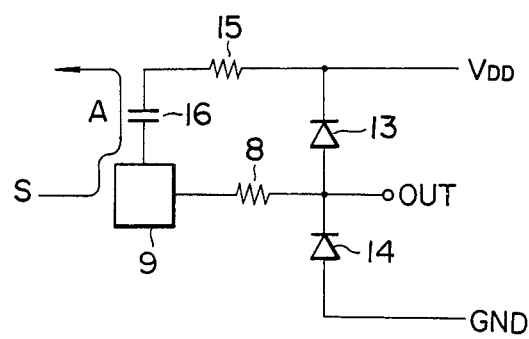
FIG. 2 is an equivalent circuit diagram of the gate protection circuit shown in FIG. 1.

FIG. 2 shows an equivalent circuit diagram of the gate protection circuit thus constructed. In the figure, the reference numeral 13 denotes a diode formed within the P-type region 3; the numeral 14 denotes another diode formed within the N-type region 6. The numeral 15 denotes a bulk resistance of the silicon substrate 1; the numeral 16 denotes a distributed capacitance formed between the bonding pad 9 and the silicon substrate 1 with the silicon oxide film 7 sandwiched therebetween as a dielectric.

As explained above, the gate protection resistor 8 can ohmicly attenuate the high surge voltage inputted through the bonding pad 9 before the surge voltage reaches the gate of the circuit, thus preventing the gate from being broken down or the circuit formed on the semiconductor substrate 1 from being activated erroneously due to high surge voltage.

In the prior-art semiconductor integrated circuit including such a gate protection circuit as described above, in the case where high-frequency high surge voltage S (500 to 600 V and 5 to 60 MHz) develops across the input terminals of the circuit, it is possible to reduce the surge voltage to some extent by increasing the resistance of the gate protection resistor 8. However, when the frequency of the surge S is extraordinarily high, there exists a danger that the surge voltage tends to leak from the bonding pad 9, through the insulating silicon oxide film 7 and the silicon substrate 1, to other circuits formed on the same substrate 1, because the distributed capacitor 16 is inevitably formed between the bonding pad 9 and the silicon substrate 1 with the silicon oxide film 7 sandwiched therebetween as a dielectric, as depicted by arrow A in FIG. 2, thus resulting in an erroneous operation in the other circuits.

In view of the above description, reference is now made to the embodiments of the semiconductor device including a gate protection circuit according to the present invention, with reference to the attached drawings.

Figure 3:
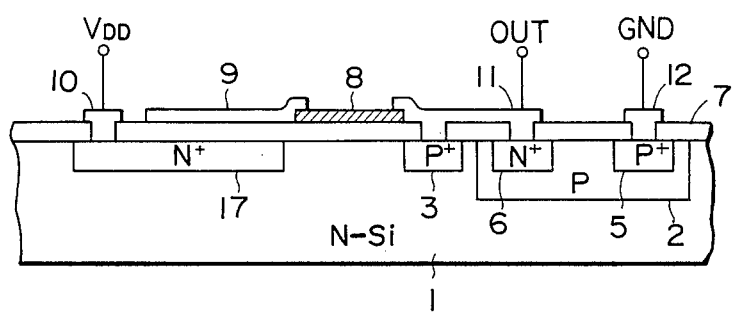
FIG. 3 is a cross-sectional view showing the structure of a first embodiment of the gate protection circuit provided for the insulated-gate semiconductor device according to the present invention.

FIG. 3 shows a first embodiment according to the present invention. In the figure, the gate protection circuit comprises a current limiting gate protection resistor 8 formed on an insulating silicon oxide film 7 and two clamping diodes corresponding to diodes 13 and 14 of FIG. 2 formed within a P-type impurity semiconductor region 3 and a N-type impurity semiconductor region 6. The gate protection resistor 8 is connected between a bonding pad 9 and a gate terminal 11 to which a circuit is further connected.

The gate protection resistor 8 serves to cause a voltage drop for the surge voltage inputted to the device through the input terminal such as the bonding pad 9, before the surge voltage is applied to the gate of the circuit.

Therefore, the higher the protection resistance, the more effectively the circuit will be protected from the high voltage.

On the other hand, in order to prevent high-frequency surge current from leaking from the bonding pad 9 to other circuits through the substrate 1 via a distributed capacitance 16 (inevitably formed between the bonding pad 9 and the substrate 1 with the silicon oxide film 7 sandwiched therebetween as a dielectric), in this embodiment, a N-type semiconductor region 17 to apply a bias voltage to the substrate 1 is so formed on the substrate 1 as to extend under the bonding pad 9 and to cover the pad, as depicted in FIG. 3. Therefore, the surface area of the capacitance 16 becomes larger and thereby the distributed capacitance 16 becomes greater than that in the prior-art structure. Further, since the N-type semiconductor region 17 is connected to the power supply line 10, it is possible to effectively by-pass the high-frequency surge current from the bonding pad 9 to the power supply line 10 via the silicon oxide film 7 and the N-type region 17, thus preventing the surge current from leaking through the substrate 1 to other circuits formed on the same substrate 1; that is, preventing the circuits from being activated erroneously.

Figure 4:
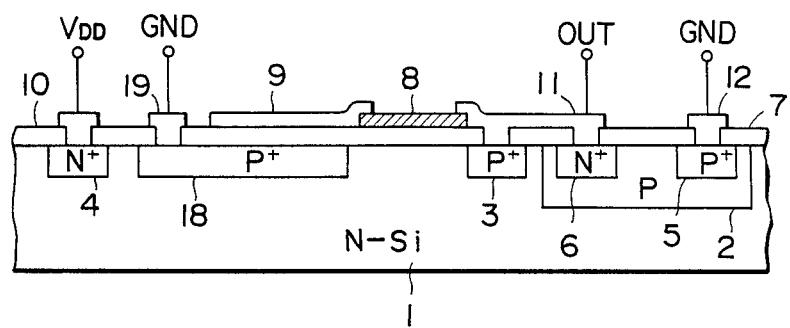
FIG. 4 is a cross-sectional view showing the structure of a second embodiment of the gate protection circuit provided for the insulated-gate semiconductor device according to the present invention.

FIG. 4 shows a second embodiment according to the present invention. In this embodiment, an additional P-type semiconductor region 18 is so formed on the substrate 1 as to extend under the bonding pad 9 and to cover the pad and an additional ground line 19 is connected to the P-type region 18. The current limiting gate protection resistor 8 and two diodes 13 and 14 are formed on the substrate in the same way as in the first embodiment.

Therefore, the surface area of the capacitance 16 becomes larger and thereby the distributed capacitance 16 becomes greater than that in the prior-art structure. Further, since the P-type region 18 is connected to the ground line 19, it is possible to effectively by-pass the high-frequency surge current from the bonding pad 9 to the ground line via the silicon oxide film 7 and the P-type region 18, thus preventing the surge current from leaking through the substrate 1 to other circuits formed on the same substrate 1; that is, preventing the circuits from being activated erroneously.

Further, in the semiconductor integrated circuits, there are two cases where high-frequency surge is by-passed to the power supply line and to the ground line according to the pattern of the gate electrode wiring. Therefore, the first embodiment is suitable for the case where the surge is by-passed to the power supply line and the second embodiment is suitable for the case where the surge is by-passed to the ground line.

As described above, in the semiconductor device including the gate protection circuit according to the present invention, since a high-concentration impurity semiconductor region (N+ or P+) is formed under the input terminal of the gate protection circuit such as the bonding pad and since this impurity semiconductor region is connected to the power supply line or ground line, it is possible to effectively by-pass high-frequency surge voltage applied to the bonding pad from an external device via the distributed capacitance formed between the bonding pad and the impurity semiconductor region with the insulating silicon oxide film as a dielectric; that is, it is possible to prevent the surge voltage from leaking to other circuits formed on the same substrate. Therefore, it is possible to securely prevent erroneous operations in the integrated circuits due to high-frequency high surge voltage.

It will be understood by those skilled in the art that the foregoing description is in terms of a preferred embodiment of the present invention wherein various changes and modifications may be made without departing from the spirit and scope of the invention, as set forth in the appended claims.

What is claim Is:

1. A protection circuit for a semiconductor device, comprising:
   a semiconductor substrate;
   an insulating film formed on said semiconductor substrate;
   an input terminal pad formed on said insulating film and connectable to an external device, said external device generating a high-frequency surge voltage;
   a circuit including a current limiting gate protection resistor formed on said film and electrically connected to said input terminal pad, and a clamping diode electrically connected to said resistor and formed at least partially in said substrate;
   at least one other circuit formed on said substrate; and
   means consisting essentially of a single semiconductor region, disposed in said semiconductor substrate directly beneath said entire input terminal pad and said insulating film, and connected to a source of reference potential, for forming with said input terminal pad and said insulating film a capacitor, for passing said high-frequency surge voltage applied to said input terminal pad to said source of reference potential.

2. A semiconductor device as set forth in claim 1, wherein said reference potential is a power supply line of said semiconductor device when said impurity semiconductor region is of N type.

3. A semiconductor device as set forth in claim 1, wherein said reference potential is a ground line of said semiconductor device when said impurity semiconductor region is of P type.

4. A gate protection circuit as claimed in claim 1, wherein said means for forming a capacitor comprises a high-concentration impurity semiconductor region.

5. A gate protection circuit as claimed in claim 1, wherein said high-concentration impurity region is arranged to lie beneath substantially all of said input terminal pad.

6. A protection circuit for a semiconductor device, comprisig:
   a semiconductor substrate;
   an insulating film formed selectively on said semiconductor substrate;
   an input terminal pad formed on said insulating film and connectable to an external device, said external device generating a high-frequency surge voltage;
   a circuit including a current limiting gate protection resistor formed on said film and electrically connected to the input terminal pad, and a clamping diode connected to said resistor and formed at least partially in said substrate; and
   a high concentration impurity region, disposed in said semiconductor substrate directly beneath said entire input terminal pad and connected to a source of reference potential, for forming with said input terminal pad and said insulating film a capacitor, said capacitor passing high frequency components of said high-frequency surge voltage to said source of reference potential when the high frequency surge voltage is applied to said input terminal pad so that the passage of the high-frequency surge voltage through the semiconductor substrate is prevented.

* * * * *